(12) United States Patent
Matsui et al.

(10) Patent No.: US 7,268,615 B2
(45) Date of Patent: Sep. 11, 2007

(54) TRAP FILTER

(75) Inventors: Hiroshi Matsui, Ota (JP); Masato Onaya, Gumma-ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 10 days.

(21) Appl. No.: 11/270,394

(22) Filed: Nov. 9, 2005

(65) Prior Publication Data

US 2006/0103764 A1    May 18, 2006

(30) Foreign Application Priority Data

Nov. 12, 2004 (JP) ............... 2004-329300

(51) Int. Cl.
*H03K 5/00* (2006.01)
(52) U.S. Cl. ...................... 327/556; 327/552
(58) Field of Classification Search ........... 327/261, 327/270, 552–559
See application file for complete search history.

(56) References Cited

U.S. PATENT DOCUMENTS 5,012,143 A * 4/1991 Boudewijns ............... 327/277
5,453,710 A * 9/1995 Gilbert et al. ............. 327/277
6,040,727 A * 3/2000 Struck et al. .............. 327/277
6,658,053 B1 * 12/2003 Aiello et al. ............... 375/224
6,891,809 B1 * 5/2005 Ciccone et al. ............ 370/289

FOREIGN PATENT DOCUMENTS

JP          9-98066          4/1997

OTHER PUBLICATIONS

English Patent Abstract of JP9098066 from esp@cenet, published Apr. 8, 1997, 1 page.

* cited by examiner

*Primary Examiner*—Dinh T. Le
(74) *Attorney, Agent, or Firm*—Osha Liang LLP

(57) ABSTRACT

A trap filter comprises a delay circuit made up of switched capacitors for delaying an input signal and outputting a delay signal, and an adding circuit for adding the input signal and the delay signal.

2 Claims, 7 Drawing Sheets

TRAP FILTER

CROSS-REFERENCE TO RELATED APPLICATIONS

The entire disclosures of Japanese Patent Application No. 2004-329300 including specification, claims, drawings, and abstract are incorporated herein by reference.

BACKGROUND OF THE INVENTION

1. Field of the Invention

The present invention relates to a trap filter, for negating a specified frequency signal by adding a delay signal that is an input signal that has been delayed, and the input signal.

2. Description of the Related Art

A composite video signal is a single signal comprised of a chrominance signal superimposed on a brightness signal, in addition to a synchronization signal. The composite video signal is generally referred to as a video signal. In order to obtain an image signal based on this video signal, in response to various objectives, it is necessary to process a signal that is the video signal with the chrominance signal removed, or a signal that is only the chrominance signal extracted from the video signal, etc.

For example, in the case of a video signal of the NTSC system, for a brightness signal bandwidth of from 0 to 4.4 MHz the chrominance signal has a bandwidth of 3.58-1.5 MHz, and 3.58+0.5 MHz. As a trap filter circuit for trapping only a signal in a frequency band with a center frequency of 3.58 MHz, in order to remove a chrominance signal from a video signal, there is known a frequency separation filter type circuit using two differential amplifiers and a reactance element.

With a frequency separation filter type circuit, frequency characteristics are determined by the gm (mutual conductance) of the differential amplifier. Therefore, it is only possible to maintain constant frequency characteristics in a range of input voltage where the amplification factor of transistors constituting the differential amplifier has a linear characteristic, and the input dynamic range in which the video signal and brightness signal can be filtered keeping a linear characteristic is narrow. Accordingly, it is necessary to cause a video signal having signal peak-to-peak value of 1V p-p to be attenuated to level of 200 mV p-p or less for input. There is then a problem that because of this attenuation the S/N ratio of the video is deteriorated. Also, the frequency characteristics of the filter are directly dependent on the resistance values and capacitance values of resistors and capacitors constituting the filter. As a result, variation in these resistance values and capacitance values is restricted, and it is difficult to adjust individual filter characteristics to desired characteristics.

SUMMARY OF THE INVENTION

A trap filter of the present invention comprises a delay circuit for delaying an input signal and outputting a delay signal, and an adder circuit for adding the input signal and the delay signal, wherein the delay circuit contains switched capacitors.

BRIEF DESCRIPTION OF THE DRAWINGS

Preferred embodiments of the present invention will be described in detail based on the following drawings, wherein.

DESCRIPTION OF THE PREFERRED EMBODIMENTS

In the following, preferred embodiments (hereafter referred to as embodiments) of the present invention will be described based on the drawings.

Embodiment 1

Figure 1:
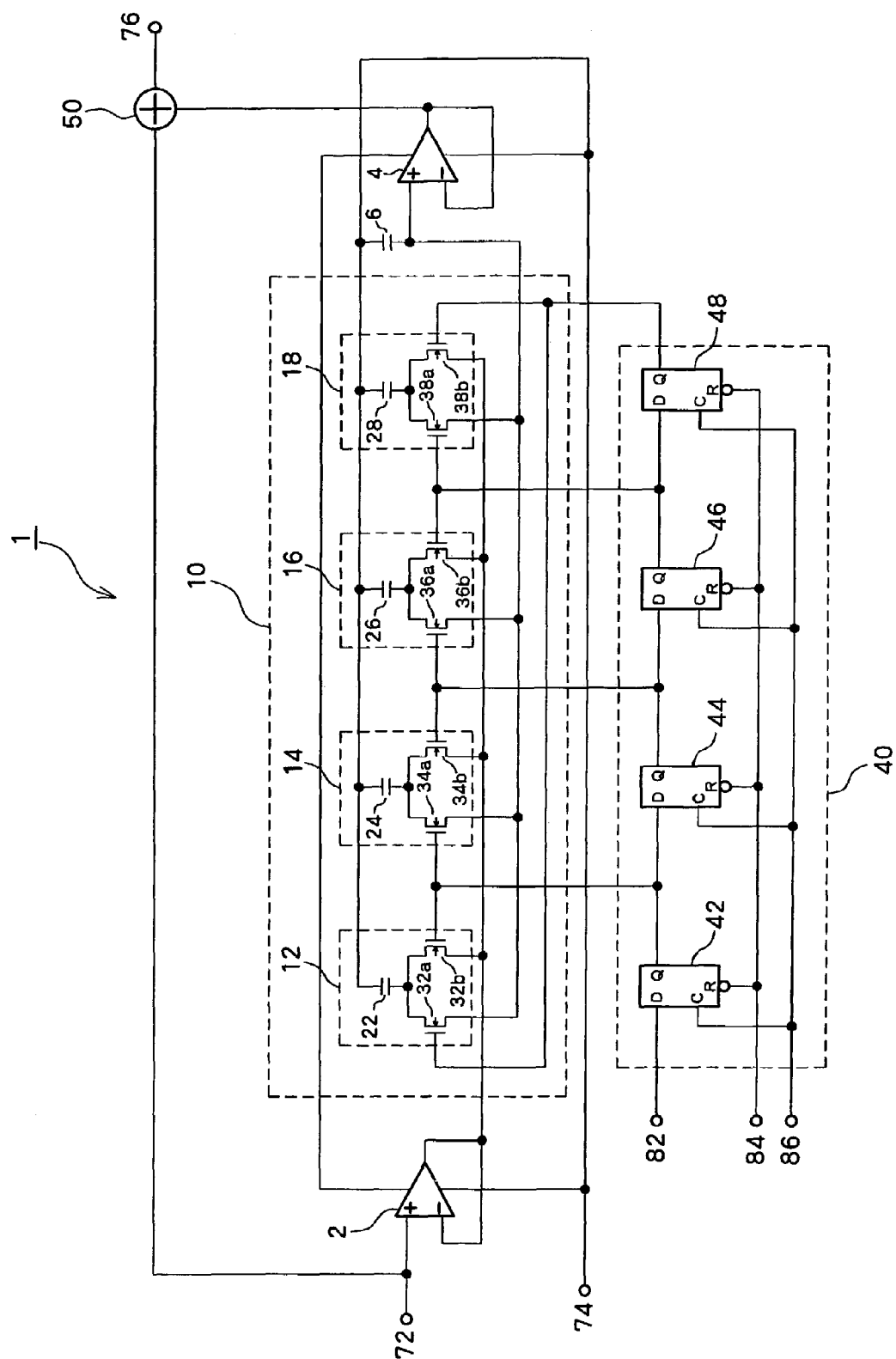
FIG. 1 is a drawing showing the circuit structure of a trap filter of a first embodiment.

FIG. 1 is a block diagram showing the circuit structure of a trap filter 1 of a first embodiment of the present invention. The trap filter 1 comprises a delay circuit 10, for delaying an input signal input from a terminal 72 and outputting a delay signal, a shift register 40 for outputting a control signal, for controlling sampling of the input signal, to the delay circuit 10, and an adder circuit 50 for adding the delay signal output by the delay circuit 10 and the input signal that is not delayed to output an output signal having a signal of a specified frequency band attenuated.

The delay circuit 10 is provided with four switched capacitors 12, 14, 16, 18. An input signal is input to the terminal 72, and a terminal 74 is grounded. The switched capacitors 12, 14, 16 and 18 are respectively provided with sampling capacitors 22, 24, 26 and 28, read-out switches 32a, 34a, 36a and 38a, and read-in switches 32b, 34b, 36b and 38b. The read-out switches 32a, 34a, 36a and 38a, and read-in switches 32b, 34b, 36b and 38b, can be configured from, for example, FETs.

One terminal of the sampling capacitor 22 contained in the switched capacitor 12 is connected to the terminal 74. The other terminal of the sampling capacitor 22 is connected to a non-inverting input of an output buffer amplifier 4 via the read-out switch 32a, and is also connected to the output terminal of an input buffer amplifier 2 via the read-in switch 32b. The other switched capacitors 14, 16 and 18 have the same structure, and are configured so that the sampling capacitors 22-28, read-out switches 32a-38a, and read-in switches 32b-38b contain in the respective switched capacitors 12-18 have the same characteristics.

The input signal is applied to the non-inverting input terminal of the input buffer amplifier 2. Also, an output voltage of the input buffer amplifier 2 is fed back to the inverting input terminal of the input buffer amplifier 2.

An output voltage of the output buffer amplifier 4 is also fed back to the inverting input terminal of the output buffer amplifier 4. The non-inverting terminal of the output amplifier 4 is also connected to the terminal 74 via an input capacitor 6, and grounded. In this way, if the read-out switches 32a, 34a, 36a and 38a are put in an ON state, charge voltages charged into the switched capacitors 12, 14, 16 and 18 are respectively output to the non-inverting terminal of the output buffer amplifier 4. The output terminal of the output buffer amplifier 4 is connected to the adder circuit 50, and the output from the output buffer amplifier 4 is input to the adder circuit 50 as a delay signal. The input signal from the terminal 72 is also input to the adder circuit 50.

The shift register 40 is made up of flip-flops 42, 44, 46 and 48 connected in series. A gate of the read-in switch 32b for charging charge to the switched capacitor 12 and a gate of the read-out switch 34a for discharging charge from the adjacent switched capacitor 14 are connected, and an output terminal Q of a first stage flip-flop 42 of the shift register 40 is connected to the point of connection between the two gates. Similarly, a gate of the read-in switch 34b of the switched capacitor 14 and a gate of the read-out switch 36a of the switched capacitor 16 are connected, and an output terminal Q of a second stage flip-flop 44 is connected to the point of connection between the two gates. A gate of the read-in switch 36b of the switched capacitor 16 and a gate of the read-out switch 38a of the switched capacitor 18 are connected, and an output terminal Q of a third stage flip-flop 46 is connected to the point of connection between the two gates. A gate of the read-in switch 38b of the switched capacitor 18 and a gate of the read-out switch 32a of the switched capacitor 12 are connected, and an output terminal Q of a fourth stage flip-flop 48 is connected to the point of connection between the two gates. The flip flops 42, 44, 46 and 48 output control signals for controlling ON/OFF states of the read-out switches 32a, 34a, 36a and 38a, and the read-in switches 32b, 34b, 36b and 38b. A reset signal and a clock signal are respectively input from terminal 84 and terminal 86 to reset terminals (R terminals) and clock terminals (C terminals) of the flip-flops 42, 44, 46 and 48 of the four-stage shift register 40. Also, a data signal from terminal 82 is input to an input terminal (D terminal) of the flip-flop 42, and signals output from the output terminals Q of the preceding flip-flops 42, 44, 46 are respectively input to the input terminals (D terminals) of the flip flops 44, 46, 48.

The adder circuit 50 can be constructed, for example, from a circuit that causes respective input signals to be connected to a non-inverting input terminal via input resistors. A filter that achieves attenuation in this way, using mutual negation of signals in a frequency band close to the center frequency, by including the delay circuit 10 and the adder circuit 50, delaying a frequency signal that it is desired to attenuate by a half cycle using the delay circuit 10, and adding together the original signal and the delayed signal in the adder circuit 50, is called a comb filter.

Figure 2:
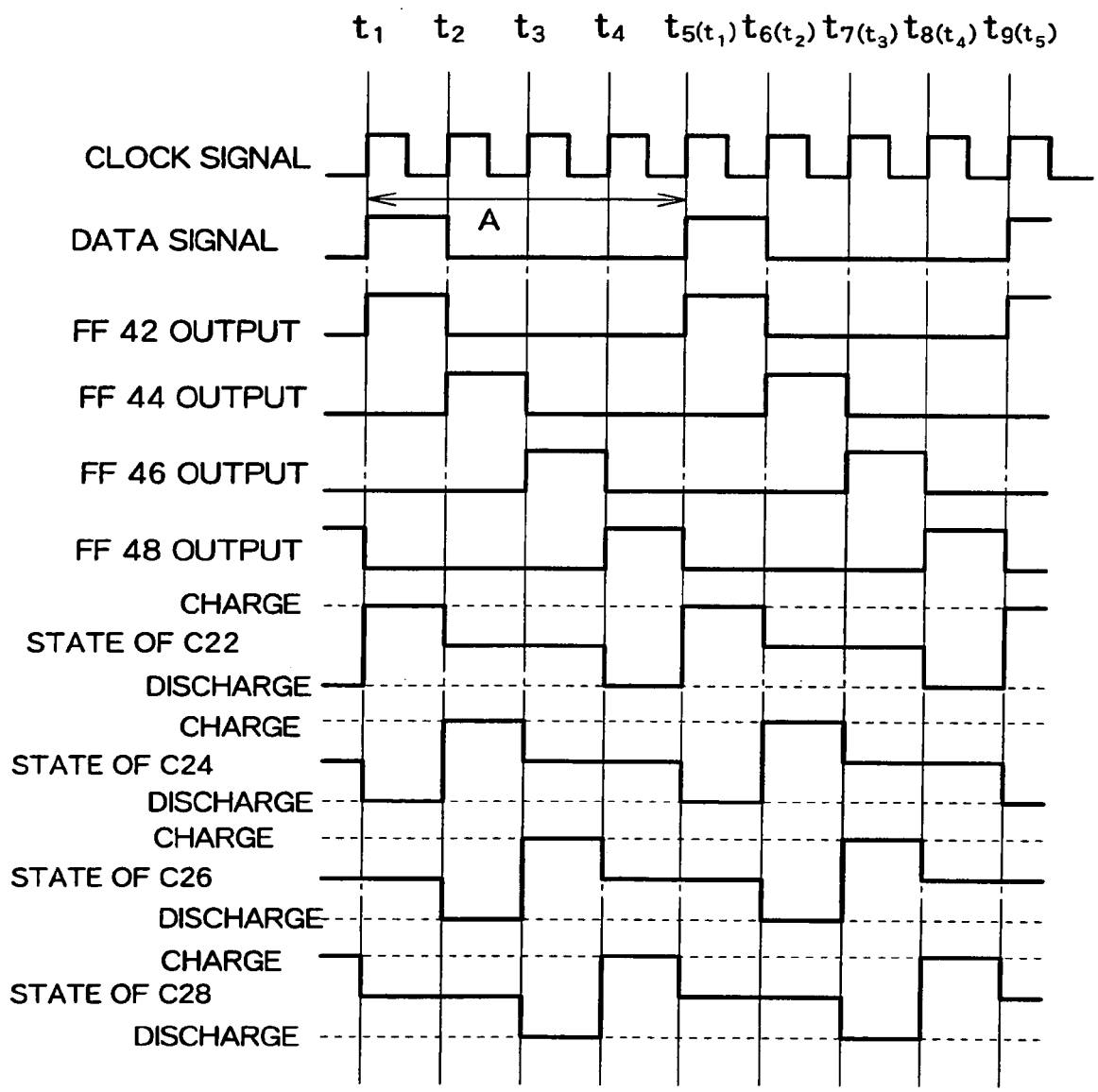
FIG. 2 is a timing chart showing operation of the trap filter of the first embodiment.

Operation of this trap filter 1 will now be described. FIG. 2 is a timing chart showing operation of the trap filter 1 of the first embodiment. An input signal input to the terminal 72 is input to the delay circuit 10 via the input buffer amplifier 2. Normally, a constantly "H" level voltage is input to the terminal 84 of the shift register 40. Also, a clock signal that repeatedly alternates between an "L" level voltage and an "H" level voltage in a specified period T is input to the terminal 86. Pulses rising at a period A, that is the number of flip-flop circuits stages in the shift register 40 multiplied by the period of the clock signal, are input to the terminal 82 as a data signal. With this embodiment, a voltage that is "H" level for one cycle in the period 4T synchronized with the clock signal is input, and for the remaining three cycles a voltage at an "L" level is input.

First of all, at time t1, in a state where an "H" level voltage, "L" level voltage, "L" level voltage and "L" level voltage are respectively input to the flip-flops 42, 44, 46 and 48, if the clock signal undergoes a transition from an "L" level voltage to an "H" level voltage only the flip-flop 42 will output an "H" level signal, while flip-flops 44, 46 and 48 will output "L" level signals. In this way, the read-in switch 32b and the read-out switch 34a are turned ON, the sampling capacitor 22 is charged using the output voltage of the input buffer amplifier 2, and the charge voltage of the sampling capacitor 24 is output to the output buffer amplifier 4. At this time, a voltage that was sampled previously 3T from time t1 is output from the sampling capacitor 24.

Next, after the data signal has changed from "H" level to "L" level together with the clock signal changing from an "H" to an "L" level, if the clock signal again goes from "L" level to "H" level at time t2 a period T after time t1, only the flip-flop 44 will output an "H" level signal, while flip-flops 42, 46 and 48 will output "L" level signals. In this way, the read-in switch 32b and the read-out switch 34a are turned OFF, and during the time from time t1 to time t2 charging of a charge voltage corresponding to the output voltage of the input buffer amplifier 2 into the sampling capacitor 22 and discharge of the sampling capacitor 24 are completed. At the same time, the read-in switch 34b and the read-out switch 36a are turned ON, and together with commencement of the sampling capacitor 24 being charged using the output voltage of the input buffer amplifier 2, the charge voltage of the sampling capacitor 26 is output to the output buffer amplifier 4. At this time, a voltage that was sampled previously 2T from time t1 is output from the sampling capacitor 26.

Next, after the data signal has changed from "H" level to "L" level together with the clock signal changing from an "H" to an "L" level, if the clock signal again goes from "L" level to "H" level at time t3 a period 2T after time t1, only the flip-flop 46 will output an "H" level signal, while flip-flops 42, 44 and 48 will output "L" level signals. In this way, the read-in switch 34b and the read-out switch 36a are turned OFF, and in the period from time t2 to time t3 charging of a charge voltage corresponding to the output voltage of the input buffer amplifier 2 into the sampling capacitor 24 and discharge from the sampling capacitor 26 are completed. At the same time, the read-in switch 36b and the read-out switch 38a are turned ON, and together with commencement of the sampling capacitor 26 being charged using the output voltage of the input buffer amplifier 2, the charge voltage of the sampling capacitor 28 is output to the output buffer amplifier 4. At this time, a voltage that was sampled previously T from time t1 is output from the sampling capacitor 28.

Next, after the data signal has changed from "H" level to "L" level together with the clock signal changing from an "H" to an "L" level, if the clock signal again goes from "L" level to "H" level at time t4 a period 3T after time t1, only the flip-flop 48 will output an "H" level signal, while flip-flops 42, 44 and 46 will output "L" level signals. In this way, the read-in switch 36b and the read-out switch 38a are turned OFF, and in the period from time t3 to time t4 charging of a charge voltage corresponding to the output voltage of the input buffer amplifier 2 into the sampling capacitor 26 and discharge from the sampling capacitor 28 are completed. At the same time, the read-in switch 38b and the read-out switch 32a are turned ON, and together with commencement of the sampling capacitor 28 being charged using the output voltage of the input buffer amplifier 2, the charge voltage of the sampling capacitor 22 is output to the output buffer amplifier 4. At this time, a voltage that was sampled at time t1 is output from the sampling capacitor 22.

By repeating the above-described steps, a voltage corresponding to the output voltage of the input buffer amplifier 2 is delayed by time 4T and sequentially output from the delay circuit 10 to the output buffer amplifier 4. The output amplifier 4 outputs this output voltage corresponding to the input voltage to the adder circuit 50.

In the adder circuit 50, the input signal that has been input from the terminal 72 and a delay signal that has been delayed by the delay circuit 10 are added and output. If the period of a center frequency ft of a frequency band it is desired to attenuate (trapped) is made Tt, and n is a natural number, then if:

$$n \times Tt/2 = 4T \qquad \text{equation (1)}$$

the input signal input from terminal 72 and the delay signal delayed 4T by the delay circuit 10 are phase shifted by a half cycle, and a signal of a frequency band with a center frequency of frequency ft is eliminated. Specifically, with the output signal of the adder circuit 50, a signal of a frequency band having a center frequency of ft is removed. With this structure, since it is not necessary to limit the input voltage to a range where the amplification factor of a transistor is held linear, it is possible to make the input dynamic range wide compared to the method of the related art. Also, resistance values and capacitance values constituting this trap filter 1 are not directly related to the frequency characteristics of the filter, which means that it is possible to expand the range of permitted values for variations in resistance values and capacitance values required to achieve the desired filter characteristics.

Since, at a specified frequency, the phase inverted input signal and delayed signal are completely removed, in the case where, for example, the adder circuit 50 is constructed using an operational amplifier non-inverting amplifier circuit, the input resistance value of this non-inverting amplifier circuit is set so that the amplitude of the input signal and the delay signal become the same.

The trap filter 1 of the first embodiment is suitable for use in removing a chrominance signal from a video signal. By applying this embodiment, only the frequency band of the chrominance signal is attenuated from the video signal at a high attenuation factor, and it is possible to extract a brightness signal by controlling attenuation of a frequency band of the brightness signal.

In the delay circuit 10 of the trap filter of the first embodiment described above, the switched capacitor has a 4-stage structure, but the number of stages of the switched capacitor is not limited to four, and as long as equation 1 is satisfied it is possible to have any structure that can delay by half the period corresponding to the frequency of a signal to be attenuated (trapped). The number of stages of the trap filter is determined according to the frequency of a signal it is desired to attenuate (trap) and the bandwidth of the input signal.

Embodiment 2

Figure 3:
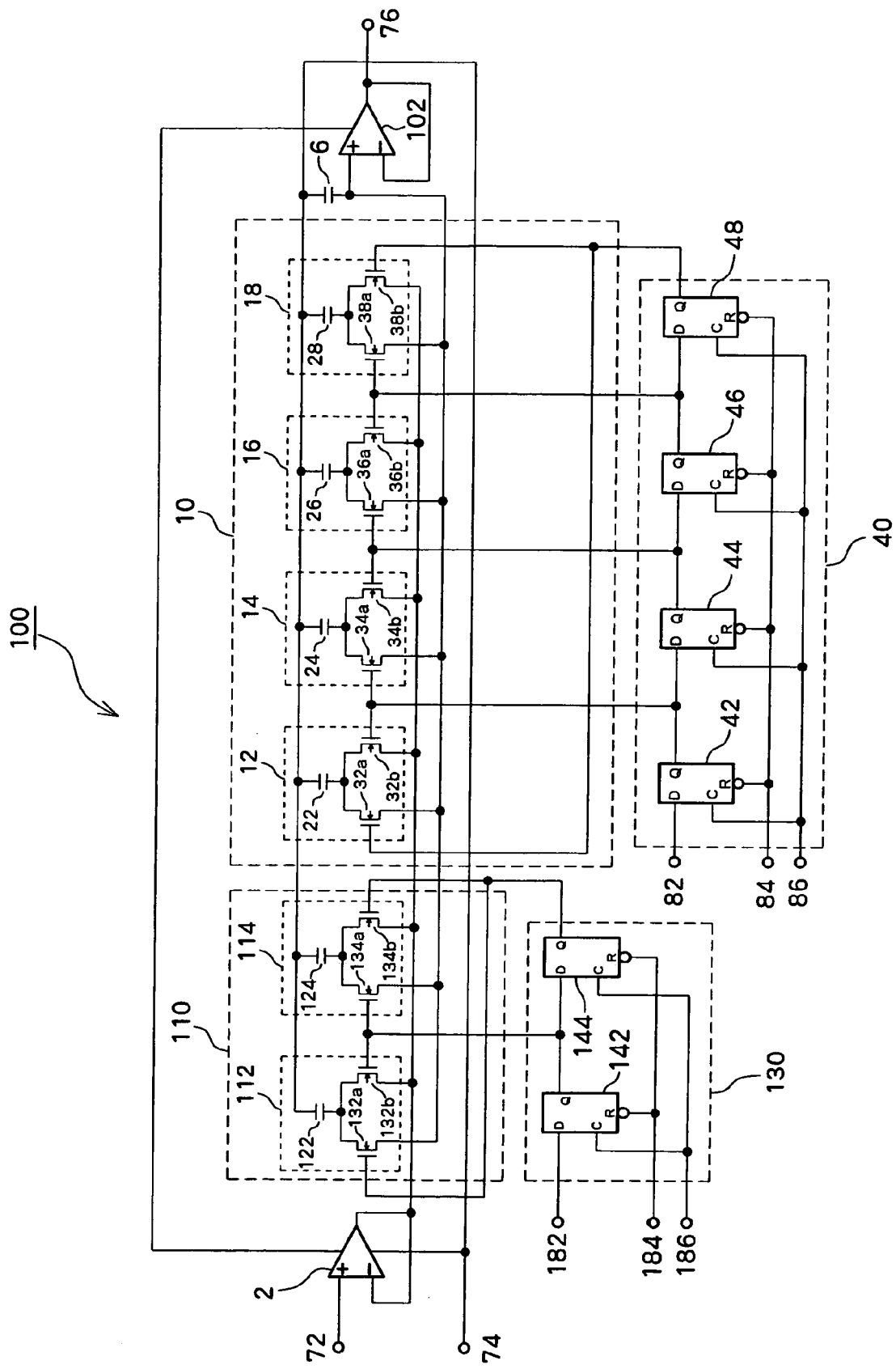
FIG. 3 is a drawing showing the circuit structure of a trap filter of a second embodiment.

FIG. 3 is a block diagram showing the circuit structure of a trap filter 100 of a second embodiment of the present invention. In addition to the structure of the trap filter 1 of the first embodiment, the trap filter 100 of the second embodiment comprises a sampling circuit 110 for sampling an input signal in synchronism with switching of the switched capacitors of the delay circuit 10 and outputting a sampling signal, a two stage shift register 130 for carrying out charging of the switched capacitors of the sampling circuit, and an addition output buffer amplifier 102 for adding the sampling signal and the delay signal.

The trap filter of the first embodiment adds an input signal that has not been sampled and a delay signal that has been sampled at a clock frequency, using the adder circuit 50, but the trap filter 100 of the second embodiment samples an input signal in a sampling circuit 110, and adds this sampling signal and a delay signal in the addition output buffer amplifier 102.

The sampling circuit 110 samples the input signal in synchronism with switching of the switched capacitors of the delay circuit 10. The sampling circuit shown in FIG. 3 is provided with two switched capacitors 112 and 114. The switched capacitors 112 and 114 have the same structure as the switched capacitors of the delay circuit 10. Specifically, the switched capacitors 112 and 114 respectively comprise sampling capacitors 122 and 124, read-out switched 132a and 134a, and read-in capacitors 132b and 134b. The read-out switches 132a and 134a, and the read-in switches 132b and 134b, 36b can be configured from, for example, FETs.

One terminal of the sampling capacitor 122 contained in the switched capacitor 112 is connected to the terminal 74. The other terminal of the sampling capacitor 122 is connected to a non-inverting input of the addition output buffer amplifier 102 via the read-out switch 132a, and is also connected to the output terminal of the input buffer amplifier 2 via the read-in switch 132b. The other switched capacitor 114 in the sampling circuit 110 has the same structure as the switched capacitor 112, and the sampling capacitor 124, read-out switch 134a, and read-in switch 134b are constructed so as to have the same characteristics as the sampling capacitor 122, read-out switch 132a and read-in switch 132b, respectively.

Also, if the read-out switches 132a and 134a are put in an ON state, a charge voltage charged in the sampling capacitors 122 and 124 is output to the non-inverting input terminal of the addition output buffer amplifier 102.

The two-stage shift register 130 is made up of flip-flops 142, and 144 connected in series. A gate of the read-in switch 132b charging charge to the sampling capacitor 122 and a gate of the read-out switch 134a discharging charge from the adjacent sampling capacitor 124 are connected, and an output terminal Q of a first stage flip-flop 142 contained in the shift register 130 is connected to the point of connection between the two gates. Similarly, a gate of the read-in switch 134b of the switched capacitor 114 and a gate of the read-out switch 132a of the switched capacitor 112 are connected, and an output terminal Q of a second stage flip-flop 144 is connected to the point of connection between the two gates. The flip-flops 142 and 144 output control signals for ON/OFF control of the read-out switches 132a and 134a, and the read-in switches 132b and 134b. A reset signal and a clock signal are respectively applied to the terminal 184 and the terminal 186 of the two-stage shift register 130. Also, a data signal is input to the terminal 182.

Figure 4:
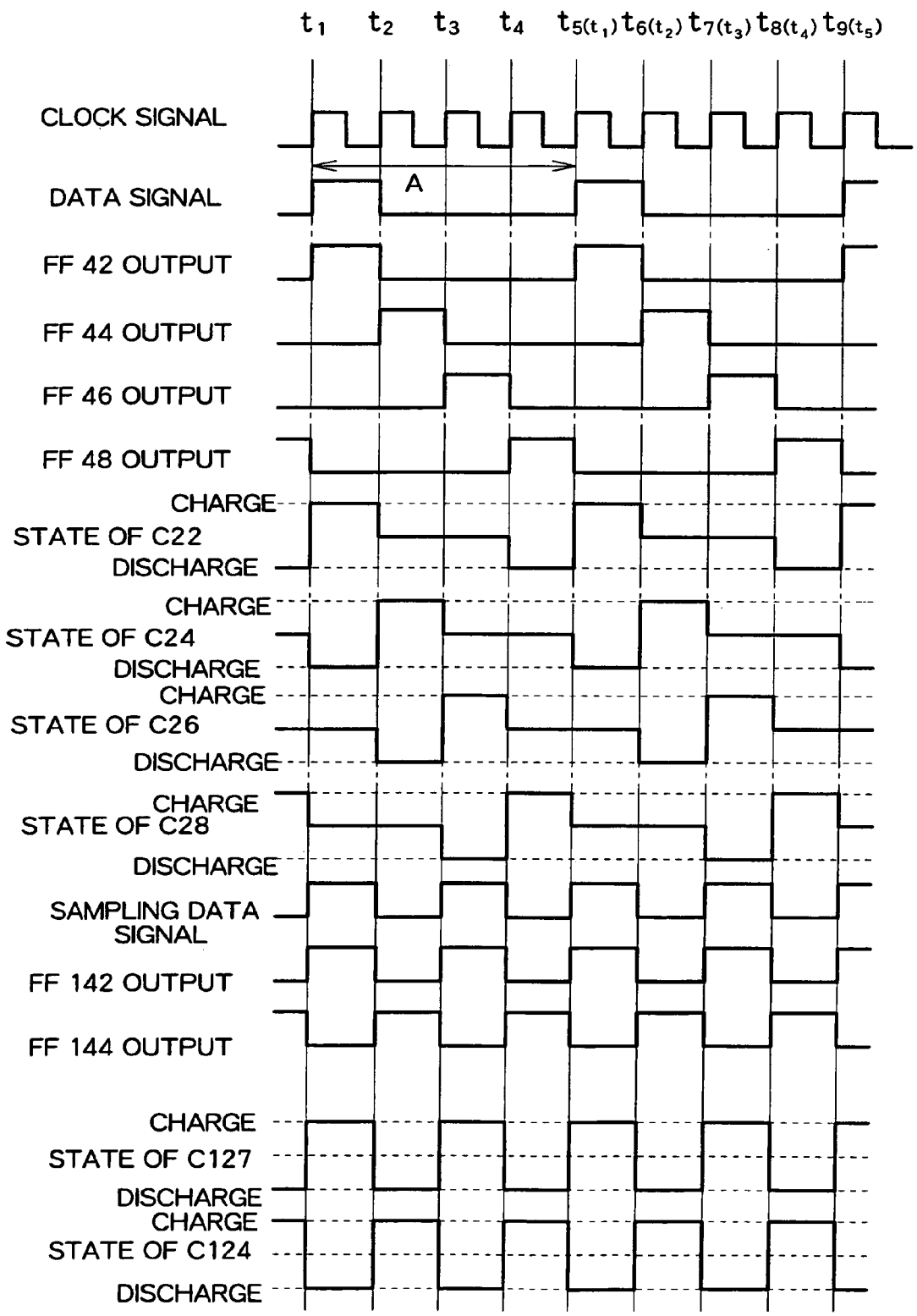
FIG. 4 is a timing chart showing operation of the trap filter of the second embodiment.

Operation of this sampling circuit 110 will now be described. FIG. 4 is a timing chart showing operation of the trap filter 100 of the second embodiment of the present invention. In synchronism with the period of a signal applied to terminal 82 connected to the 4-stage shift register 40, a clock signal that repeatedly alternates between "H" level voltage and "L" level voltage is input to the terminal 182 connected to the two-stage shift register 130. The same reset signal and clock signal as are respectively input to the terminals 84 and 86 connected to the four stage shift register 40 are respectively input to the terminals 184 and 186. The flip-flops 42, 44, 46 and 48, and the sampling capacitors 22, 24, 26 and 28 operate in the same manner as in the first embodiment, and so description of the operation is omitted here.

An input signal that has been input to the terminal 72 is input to the sampling circuit 110 via the input buffer amplifier 2. A voltage that is "H" level for one cycle in the period 2T synchronized with the clock signal is input to the data terminal 182 of the two-stage shift register 130, and for the remaining cycle a voltage at an "L" level is input.

First of all, at time t1, in a state where an "H" level voltage and "L" level voltage are respectively input to the flip-flops 142 and 144, if the clock signal undergoes a transition from an "L" level voltage to an "H" level voltage only the flip-flop 142 will output an "H" level signal, while the flip-flop 144 will output an "L" level signal. In this way, the read-in switch 132b and the read-out switch 134a are turned ON, the sampling capacitor 122 is charged using the output voltage of the input buffer amplifier 2, and the charge voltage of the sampling capacitor 124 is output to the addition output buffer amplifier 102. At this time, a voltage that was sampled previously T from time t1 is output from the sampling capacitor 124.

Next, after the sampling signal has changed from "H" level to "L" level together with the clock signal changing from an "H" to an "L" level, if the clock signal again goes from "L" level to "H" level at time t2 a period T after time t1, the flip-flop 144 will output an "H" level signal, while flip-flops 142 will output an "L" level signal. In this way, the read-in switch 132b and the read-out switch 134a are turned OFF, and in the period from time t1 to time t2 charging of a charge voltage corresponding to the output voltage of the input buffer amplifier 2 into the sampling capacitor 122 and discharge from the sampling capacitor 124 are completed. At the same time, the read-in switch 134b and the read-out switch 132a are turned ON, and together with commencement of the sampling capacitor 124 being charged using the output voltage of the input buffer amplifier 2, the charge voltage of the sampling capacitor 122 is output to the addition output buffer amplifier 102. At this time, a voltage that was sampled previously at time t1 is output from the sampling capacitor 122.

By repeating the above-described steps, a voltage corresponding to the output voltage of the input buffer amplifier 2 is delayed by time T and sequentially output from the sampling circuit 110 to the addition output buffer amplifier 102.

A charge corresponding to a sampling signal that has been delayed by a time T from the sampling circuit 110, and a charge corresponding to a delay signal that has been delayed by a time 4T from the delay circuit 10 are input to the addition output buffer amplifier 102, and a voltage corresponding to the added charges is output. If the period of a center frequency ft of a frequency band it is desired to attenuate (trapped) is made Tt, and n is a natural number, then if:

$$n+Tt/2=4T-T \qquad \text{equation (2)}$$

the sampling signal that has been delayed time T from the sampling circuit 110 and the signal delayed 4T by the delay circuit 10 are phase shifted by a half cycle, and a signal of a frequency band with a center frequency of frequency ft is eliminated. Specifically, with the output signal of the addition output buffer amplifier 102, a signal of a frequency band having a center frequency of ft is removed. With this structure, since the sampling signal and the delay signal are sampled together at the period T, frequency components included in the sampling signal and the delay signal are equal. Therefore, the trap filter 100 of the second embodiment can remove signal components of a desired frequency band with a higher attenuation factor than the trap filter 1 of the first embodiment.

In the above-described sampling circuit 110 of the trap filter 100 of the second embodiment, the switched capacitor has a two-stage structure, and the switched capacitor of the delay circuit 10 has a four stage structure, but the number of stages of the switched capacitors is not limited as long as equation (2) is satisfied. The number of stages of the trap filter is determined according to the frequency of a signal it is desired to attenuate (trap) and the bandwidth of the input signal.

Embodiment 3

Figure 5:
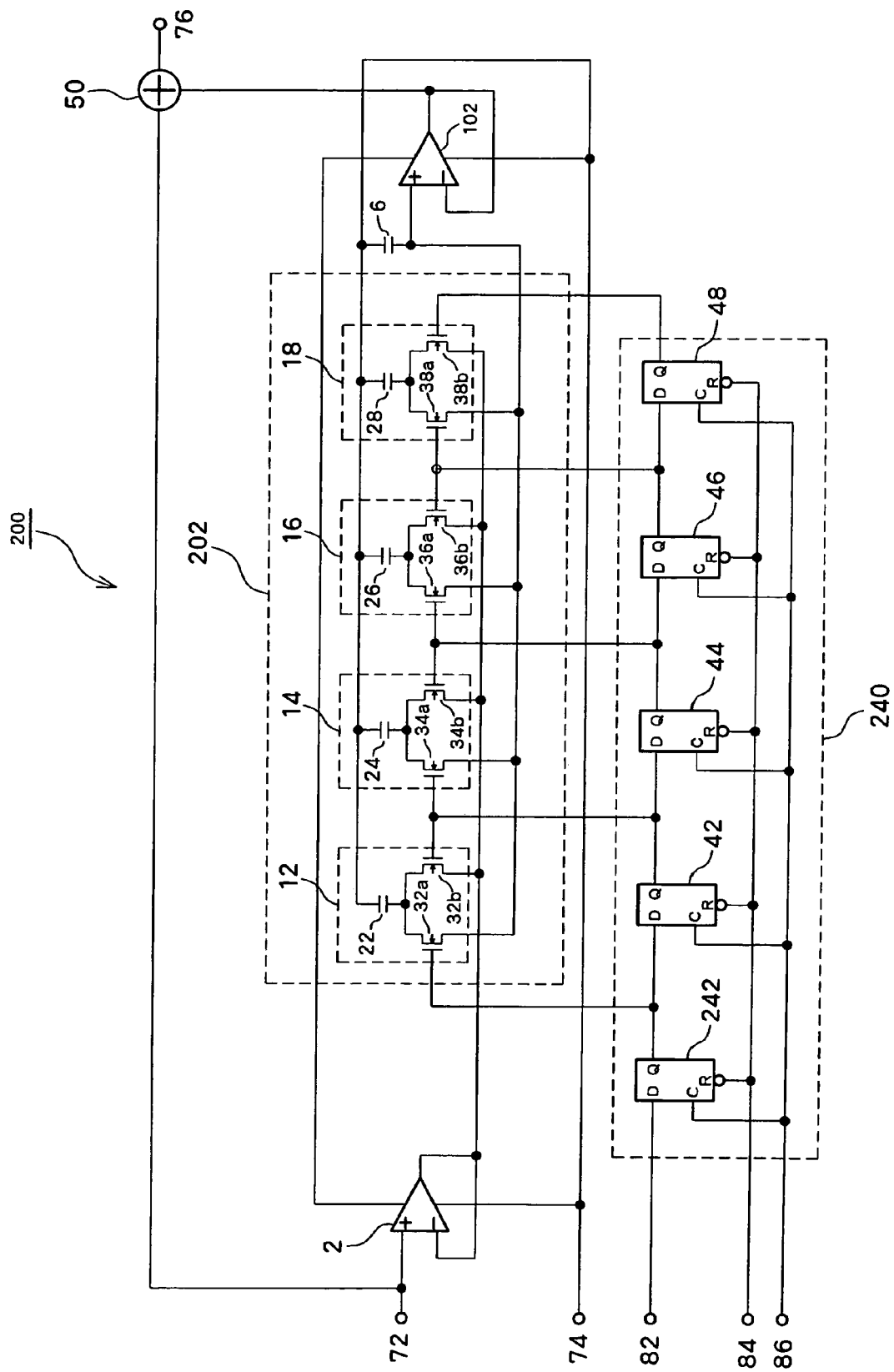
FIG. 5 is a drawing showing the circuit structure of a trap filter of a third embodiment.

FIG. 5 is a block diagram showing the circuit structure of a trap filter 200 of a third embodiment of the present invention. Compared to the delay circuit 10 and four stage shift register 40 of the trap filter 1 of the first embodiment, the trap filter 200 of the third embodiment is configured with the four stage shift register 40 replaced by a five stage shift register 240. Also, the five stage shift register 240 has a flip-flop 242 before the serially connected flip-flops 42, 44, 46 and 48. The output terminal Q of the flip-flop 242 at the initial stage is connected to the gate of read-out switch 32a for discharging charge from the switched capacitor 12, the output terminal Q of the flip flop 48 is connected to the gate of read-in switch 38b for charging charge to the switched capacitor 18, and the circuit structure is different from previous embodiments in that the gate of the read-in switch 38b and the gate of the read-in switch 32a are not connected.

Figure 6:
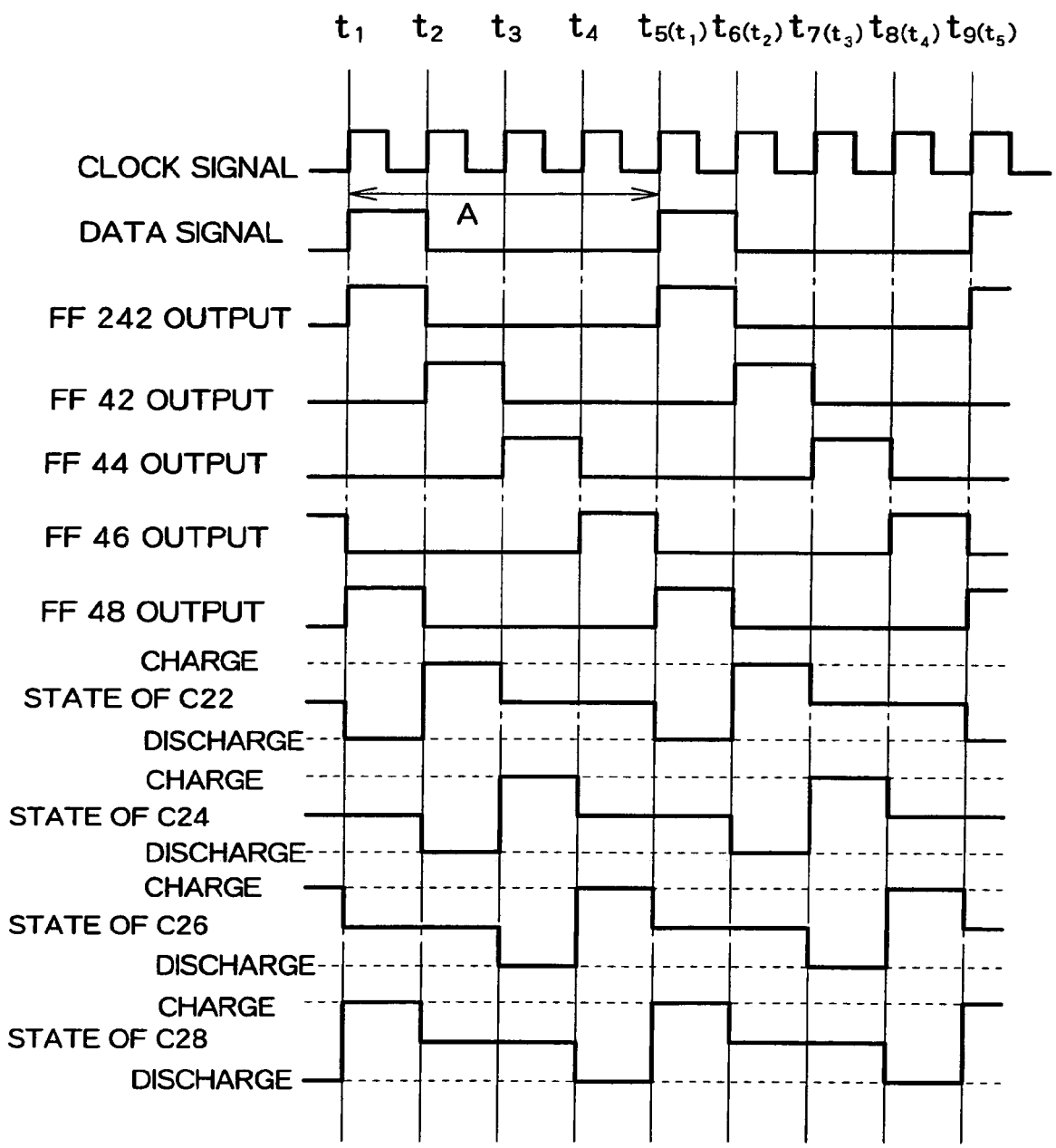
FIG. 6 is a timing chart showing operation of the trap filter of the third embodiment.

Operation of this trap filter 200 will now be described. FIG. 6 is a timing chart showing operation of the trap filter 200 of the third embodiment of the present invention. An input signal input to the terminal 72, a reset signal input to the reset terminal 84, a clock signal input to the clock terminal 86, and a data signal input to the data terminal 82 are the same as those of the trap filter of the first embodiment.

First of all, at time t1, in a state where the "H" level voltage is input to the flip-flop 242 as same as flip flop 48, if the clock signal undergoes a transition from an "L" level voltage to an "H" level voltage only the flip-flops 242 and 48 will output an "H" level signal, while the flip-flops 42, 44 and 46 will output an "L" level signal. In this way, the read-in switch 38b and the read-out switch 32a are turned ON, the sampling capacitor 28 is charged using the output voltage of the input buffer amplifier 2, and the charge voltage of the sampling capacitor 22 is output to the output buffer amplifier 4. At this time, a voltage that was previously sampled 3T from time t1 is output from the sampling capacitor 22.

Next, after the clock signal has changed from an "H" to an "L" level, the data signal changes from "H" level to "L" level, and if the clock signal again goes from "L" level to "H" level at time t2 a period T after time t1, only the flip-flop 42 will output an "H" level signal, while flip-flops 242, 44, 46 and 48 will output an "L" level signal. In this way, the read-in switch 38b and the read-out switch 32a are turned OFF, and in the period from time t1 to time t2 charging of a charge voltage corresponding to the output voltage of the input buffer amplifier 2 into the sampling capacitor 28 and discharge from the sampling capacitor 22 are completed. At the same time, the read-in switch 32b and the read-out switch 34a are turned ON, and together with commencement of the sampling capacitor 22 being charged using the output voltage of the input buffer amplifier 2, the charge voltage of the sampling capacitor 24 is output to the output buffer amplifier 4. At this time, a voltage that was previously sampled 2T from time t1 is output from the sampling capacitor 24.

Next, after the clock signal has changed from an "H" to an "L" level, the data signal changes from "H" level to "L" level, and if the clock signal again goes from "L" level to "H" level at time t3 a period 2T after time t1, only the flip-flop 44 will output an "H" level signal, while flip-flops 242, 42, 46 and 48 will output an "L" level signal. In this way, the read-in switch 32b and the read-out switch 34a are turned OFF, and in the period from time t2 to time t3 charging of a charge voltage corresponding to the output voltage of the input buffer amplifier 2 into the sampling capacitor 22, and discharge from the sampling capacitor 24 are completed. At the same time, the read-in switch 34b and the read-out switch 36a are turned ON, and together with commencement of the sampling capacitor 24 being charged using the output voltage of the input buffer amplifier 2, the charge voltage of the sampling capacitor 26 is output to the output buffer amplifier 4. At this time, a voltage that was sampled previously T from time t1 is output from the sampling capacitor 26.

Next, after the clock signal has changed from an "H" to an "L" level, the data signal changes from "H" level to "L" level, and if the clock signal again goes from "L" level to "H" level at time t4 a period 3T after time t1, only the flip-flop 46 will output an "H" level signal, while flip-flops 242, 42, 44 and 48 will output an "L" level signal. In this way, the read-in switch 34b and the read-out switch 36a are turned off, and in the period from time t3 to time t4 charging of a charge voltage corresponding to the output voltage of the input buffer amplifier 2 into the sampling capacitor 24 and discharge from the sampling capacitor 26 are completed. At the same time, the read-in switch 36b and the read-out switch 38a are turned ON, and together with commencement of the sampling capacitor 26 being charged using the output voltage of the input buffer amplifier 2, the charge voltage of the sampling capacitor 28 is output to the output buffer amplifier 4. At this time, a voltage that was sampled previously at time t1 is output from the sampling capacitor 28.

As described above, in the five stage shift register 240, in order to cause the same operation as for the four switched capacitors 12, 14, 16 and 18 of the delay circuit 10 of the trap filter 1 of the first embodiment, the initial stage flip-flop 242 for outputting the read-in control signal for the initial stage switched capacitor 12, and the fifth stage and final stage flip-flop 48 for outputting a read-out control signal for the fifth and final stage switched capacitor 18, output the same signal. By causing the initial and final stage flip-flops to operate in this way, with the trap filter 200 of this third embodiment the fifth flip-flop 48 and the first flip-flop 242 can output the same signal as the fourth and final stage flip-flop 48 of the trap filter 1 of the first embodiment.

According to this structure, it is not necessary to connect from the fourth flip-flip 48 arranged closet to the switched capacitor 18 to the switch 32a that is the furthest of the switches, which means that among wiring lines to the switches from the shift register it is possible to remove the wiring line from the fourth flip-flop 48 to the switch 32a, which is the longest one, and it is possible to increase the semiconductor layout efficiency.

In the above described trap filter 200 of the third embodiment, the shift register 240 for driving the switches has a five stage flip-flop structure, but the flip-flop structure is not limited to five stages, and by having a structure with a number of stages that is one more than the number of stages of switched capacitors and outputting the same signal from the initial stage flip-flop and the final stage flip-flop it is possible to achieve a desired period delay in the delay circuit 10.

It is also desirable to apply this structure to the delay circuit 10 and shift register 40 of the trap filter 100 of the second embodiment.

Embodiment 4

Figure 7:
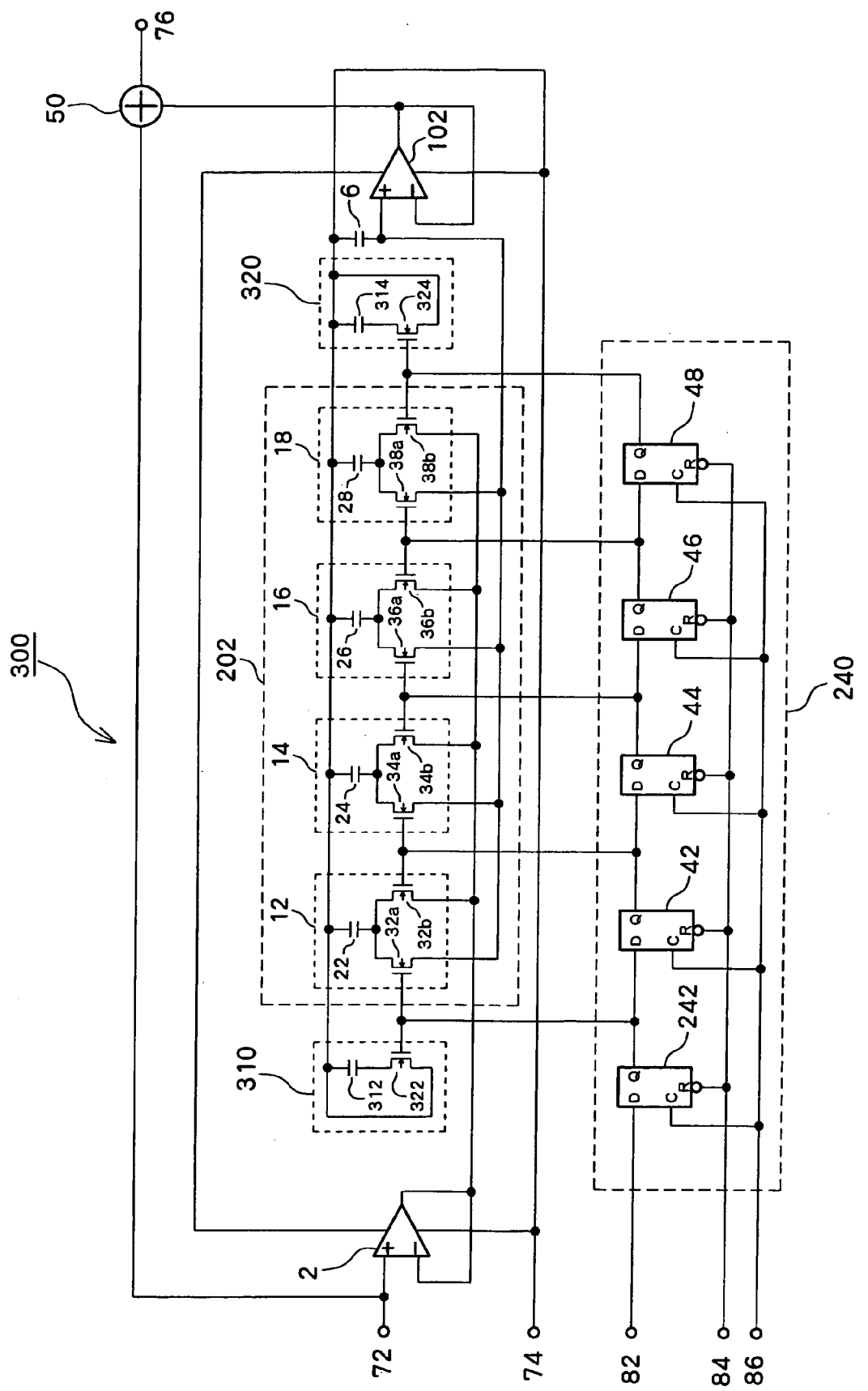
FIG. 7 is a drawing showing the circuit structure of a trap filter of a fourth embodiment.

FIG. 7 is a block diagram showing the circuit structure of a trap filter 300 of a fourth embodiment of the present invention. In addition to the structure of the trap filter 200 of the third embodiment, the trap filter 300 of the fourth embodiment comprises an initial stage dummy switched capacitor 310 connected to the initial stage switched capacitor 12 of the delay circuit 10, and a final stage dummy switched capacitor 320 connected to the final stage switched capacitor 18.

One terminal of the sampling capacitor 312 contained in the initial stage dummy switched capacitor 310 is connected to the terminal 74. The other terminal of the sampling capacitor 312 is connected to the terminal 74 via switch 322, which is a load dummy element. The gate of the switch 322 is connected to the gate of the switch 32a.

One terminal of the sampling capacitor 314 contained in the final stage dummy switched capacitor 320 is connected to the terminal 74. The other terminal of the sampling capacitor 314 is connected to the terminal 74 via switch 324, which is a load dummy element. The gate of the switch 324 is connected to the gate of the switch 38a.

In the trap filter 300 of the fourth embodiment, the switch 322, switch 32a, switch 324 and switch 38a are configured so as to have the same characteristics.

According to this structure, since load of the output terminals Q of all of the flip-flops is equal, it is possible to make rising and falling characteristics of the output voltage attributable to load differences uniform for all of the flip-flops. In the trap filter 300 of the fourth embodiment, because uniformity of the rising and falling characteristics of the output voltage for all flip-flops is improved, it is possible to improve uniformity of input signal sampling separation, and to attenuate a signal of a specified frequency band effectively.

In this fourth embodiment, the load dummy elements connected to the output terminals of the initial stage and final stage of the shift register are switches constituted by FETs, for example, having the same characteristics as the switch 32a and the switch 38a, but the load dummy elements are not limited to switch elements constituted as FETs, and it is possible to use elements with a load equivalent to the read-in switch element 38b or the read-out switch element 32a. This type of load dummy element can be configured using resistors and capacitors, for example. Making load dummy elements into switch elements having the same characteristics as the switch 32a and the switch 38a is preferable because design is simplified if the load dummy element has a common structure with the switch 32a and the switch 38a, and because manufacture is simplified if it is made possible to form the load dummy element using a common process with the switch 32a and the switch 38a.

It is also desirable to apply this structure to the delay circuit 10 of the trap filter 100 of the second embodiment.

The description above has been given assuming an NTSC analog video signal as the input signal, but it also possible to use color systems of other standards, and apply the invention to trapping of signals in a frequency band not specifically limited to broadband signals.

What is claimed is:

1. A trap filter, comprising:
a delay circuit for delaying an input signal and outputting a delay signal;
wherein the delay circuit comprises:
   a plurality of switched capacitors, wherein each switched capacitor comprises:
      a sampling capacitor,
      a read-in switch element configured to charge the switch capacitor to a voltage corresponding to the input signal voltage, and
      a read-out switch element configured for outputting a voltage of the switch capacitor,
   delaying the input signal by sequentially outputting the charge voltage after being held in the sampling capacitor for a specified time;
an adder circuit for adding the input signal and the delay signal; and
a shift register for controlling a charge and discharge voltage of the sampling capacitor by sequentially outputting control signals to the read-in switch elements and the read-out switch elements,
wherein the delay circuit further comprises n (n is an integer of 3 or more) stages of switched capacitors and the shift register comprises n+1 stages of flip-flops, wherein an output terminal of an initial stage flip-flop of the shift register is connected to a control terminal of the read-out switch element that is connected to an initial stage switched capacitor of the delay circuit, and
wherein load dummy elements having loads equivalent to the read-in switch element and the read-out switch element are connected to the output terminals of the initial stage and final stage of the shift register, respectively.

2. The trap filter of claim 1, wherein the load dummy elements are switch elements equivalent to the read-in switch element or the read-out switch element.

* * * * *